US012721017B2

(12) United States Patent
Yang

(10) Patent No.: US 12,721,017 B2
(45) Date of Patent: Aug. 25, 2026

(54) DISPLAY PANEL AND DISPLAY DEVICE

(71) Applicant: TCL CHINA STAR OPTOELECTRONICS TECHNOLOGY CO., LTD., Shenzhen (CN)

(72) Inventor: Weiheng Yang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 118 days.

(21) Appl. No.: 18/900,816

(22) Filed: Sep. 29, 2024

(65) Prior Publication Data

US 2025/0143153 A1 May 1, 2025

(30) Foreign Application Priority Data

Oct. 25, 2023 (CN) ......................... 202311390561.2

(51) Int. Cl.
*H10K 59/80* (2023.01)
*H10K 59/38* (2023.01)

(52) U.S. Cl.
CPC ......... *H10K 59/8791* (2023.02); *H10K 59/38* (2023.02); *H10K 59/873* (2023.02)

(58) Field of Classification Search
CPC . H10K 59/87914; H10K 59/38; H10K 59/873
See application file for complete search history.

(56) References Cited

U.S. PATENT DOCUMENTS

2023/0309365 A1* 9/2023 Zhu ...................... H10K 59/122
2024/0040883 A1* 2/2024 Zhou .................... H10K 59/879
2024/0154073 A1* 5/2024 Lee .................... H10H 20/8513
2024/0306465 A1* 9/2024 Tian ....................... H10K 59/38

* cited by examiner

*Primary Examiner* — Anne M Hines
(74) *Attorney, Agent, or Firm* — PV IP PC; Peter Stecher; Wei Te Chung

(57) ABSTRACT

The present disclosure provides a display panel and display device. The display panel comprises a drive substrate, a light-emitting device layer, an encapsulation layer, and an optical film layer. The light-emitting device layer is located on the drive substrate. The encapsulation layer covers the light-emitting device layer. The optical film layer is located on the encapsulation layer, and multiple openings are provided on the optical film layer. The color filter layer includes multiple color resistors, which are arranged within the opening. The refractive index of the optical film layer gradually decreases along a direction away from the encapsulation layer through the optical film layer.

19 Claims, 1 Drawing Sheet

DISPLAY PANEL AND DISPLAY DEVICE

CROSS-REFERENCE TO RELATED APPLICATION

The present disclosure claims priority to Chinese Patent Application No. 202311390561.2, filed on Oct. 25, 2023, the content of which is incorporated herein by reference in its entirety.

TECHNICAL FIELD

The present disclosure relates to the field of display technologies.

BACKGROUND

Organic Light Emitting Diode (OLED) display panels initially used circular polarizer technology to overcome the strong reflection problem caused by external environmental light on OLED. With the development of technology, Pol-less technology has emerged, which can remove polarizers and achieve flexibility of OLED while reducing costs. With the continuous development of Pol-less technology, it has been widely applied in the field of display. However, there are still some drawbacks to the existing Pol-less technology. For example, due to the periodic structure of the black matrix (BM) in the Pol-less structure, it is prone to generate the phenomenon of color glare. In addition, at a large viewing angle, the BM area blocks the transmission of some light intensity, resulting in a loss of overall light intensity and affecting the display effect of the display panel.

SUMMARY

A display panel according to one or more embodiments of the present disclosure includes: a drive substrate, a light-emitting device, an encapsulation layer, an optical film layer and a color filter layer. The light-emitting device layer located on the drive substrate; the encapsulation layer covering the light-emitting device layer; the optical film layer located on the encapsulation layer, wherein the optical film layer is provided with multiple openings; and the color filter layer comprising multiple color resistors, wherein the color resistors are arranged within the opening; wherein, a refractive index of the optical film layer gradually decreases along the direction away from the encapsulation layer through the optical film layer.

In an embodiment of the present disclosure, the optical film layer comprises multiple film layers arranged in a stack, and the refractive indexes of the multiple film layers decrease sequentially along the direction away from the encapsulation layer through the optical film layer.

In an embodiment of the present disclosure, the optical film layer comprises a first film layer and a second film layer arranged in a stack, the first film layer is adjacent to the encapsulation layer, and the refractive index of the first film layer is greater than that of the second film layer.

In an embodiment of the present disclosure, a refractive index of the first film layer is in a range of 1.61-1.65, and a refractive index of the second film layer is in a range of 1.35-1.39.

In an embodiment of the present disclosure, the first film layer comprises a first main material, which comprises resin, and the second film layer comprises a second main material, which includes a fluorine-containing resin.

In an embodiment of the present disclosure, the first film layer further comprises a first particle, and the second film layer further comprises a second particle, the first particle is dispersed in the first main material and the second particle is dispersed in the second main material.

In an embodiment of the present disclosure, the refractive index of the first particle is in a range of 1.6-2.3, and the refractive index range of the second particle is in a range of 1.2-1.35.

In an embodiment of the present disclosure, the material of the first particle is an inorganic material, and the material of the second particle is a metal oxide.

In an embodiment of the present disclosure, the thickness of the first film layer is in a range of 3 μm to 4 μm, and the thickness of the second film layer is in a range of 80 nm to 110 nm.

In an embodiment of the present disclosure, the optical film layer is made of a transparent material.

A display device according to one or more embodiments of the present disclosure includes a display panel, which includes: a drive substrate; a light-emitting device layer located on the drive substrate; an encapsulation layer covering the light-emitting device layer; an optical film layer located on the encapsulation layer, wherein the optical film layer is provided with multiple openings; and a color filter layer comprising multiple color resistors, wherein the color resistors are arranged within the opening; wherein a refractive index of the optical film layer gradually decreases along a direction away from the encapsulation layer through the optical film layer.

DETAILED DESCRIPTION

The technical solutions in the embodiments of the present disclosure will be clearly and completely described with reference to the accompanying drawings. It will be apparent that the described embodiments are only parts of the embodiments of the present disclosure, but not all of them. Based on the embodiments in the present disclosure, all other embodiments obtained by the skilled person in the art without creative labour fall within the scope of the present disclosure.

In the description of the present disclosure, it should be understood that the terms “above”, “below”, etc. indicate orientation or positional relationships based on the orientation or positional relationships shown in the accompanying drawings, which are used only for the convenience of describing the present disclosure and simplifying the description, without indicating or implying that the device or component referred to must have a specific orientation, be constructed and operated in a specific orientation, and therefore cannot be understood as a limitation of the present disclosure. In addition, the terms “first” and “second” are only used for descriptive purposes and cannot be understood as indicating or implying relative importance or implying the number of technical features indicated. Thus, the features limited with “first” and “second” may explicitly or implicitly include one or more of the aforementioned features. In the description of the present disclosure, “multiple” means two or more, unless expressly and specifically defined otherwise.

The present disclosure may repeat reference numbers and/or reference letters in different embodiments, for the purpose of simplification and clarity. It does not indicate a relationship among various embodiments and/or configurations being discussed.

It will be understood for the skilled person in the art that modifications or equivalent substitutions may be made to embodiments of the present disclosure without departing from the idea and the scope of the present disclosure, and that such modifications or equivalent substitutions are intended to be included within the scope of the present disclosure. Also, each embodiment may be combined with others but will not be redundantly described individually.

Figure 1:
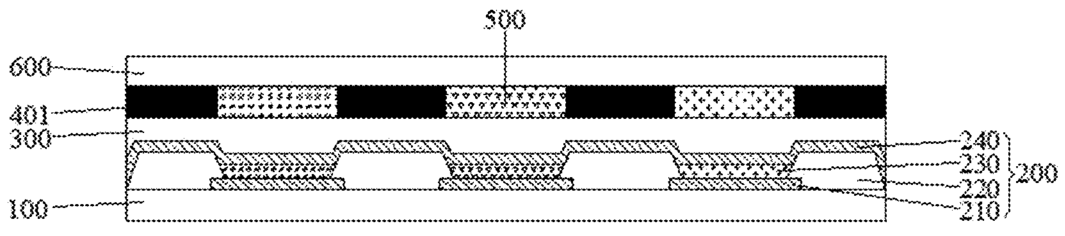
FIG. 1 is a schematic diagram of a structure of a display panel in the prior art.

As shown in FIG. 1, FIG. 1 is a schematic diagram of the structure of a display panel in the prior art. The display panel is an OLED display panel, which includes a drive substrate 100, a light-emitting device layer 200 located on the drive substrate 100, an encapsulation layer 300 covering the light-emitting device layer 200, a black matrix 401 with an opening located on the encapsulation layer 300, a color filter layer 500 located inside the opening, and a cover plate 600 located on the black matrix 401 and the color filter layer 500. The OLED display panel adopts a Pol-less structure, using a color filter layer 500 and a black matrix 401 instead of traditional circular polarizers to overcome the problem of the strong reflection caused by external environmental lights. However, the black matrix 401 in the existing Pol-less structure is prone to generate the phenomenon of color glare, while at large viewing angles the black matrix area partially blocks the transmission of light intensity due to its opacity. As the viewing angle increases, the loss of transmitted light intensity increases, reducing the overall light utilization efficiency of the display panel and affecting the display effect of the panel.

In order to solve the above problems, the present disclosure proposes a display panel and display device that can overcome the phenomenon of color glare, improve the problem of losing light intensity at large viewing angles, increase light utilization efficiency, and improve the display effect of the display panel.

The display panel and the display device provided in the present disclosure will be described in detail with specific embodiments and accompanying drawings.

Figure 2:
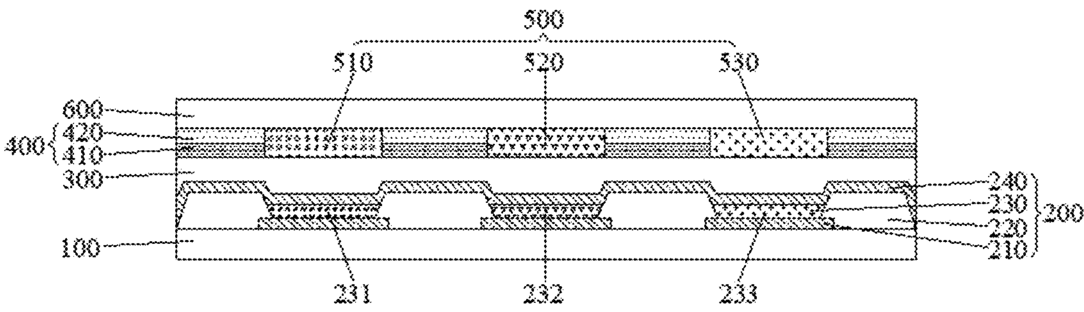
FIG. 2 is a schematic diagram of a structure of a display panel according to an embodiment of the present disclosure.

As shown in FIG. 2, FIG. 2 is a schematic diagram of the structure of a display panel according to an embodiment of the present disclosure. The display panel includes: a drive substrate 100; a light-emitting device layer 200 located on the drive substrate 100; an encapsulation layer 300 covering the light-emitting device layer 200; an optical film layer 400 located on the encapsulation layer 300, wherein the optical film layer 400 is provided with multiple openings; and a color filter layer 500 includes multiple color resistors, which are arranged within the openings; wherein the refractive index of the optical film layer 400 gradually decreases along a direction from the encapsulation layer 300 through the optical film layer 400.

The drive substrate 100 includes a substrate and a driving functional layer disposed on the substrate. The material of the substrate can be glass or flexible material. The driving functional layer includes a thin film transistor (TFT). The thin film transistor comprises an active layer, a gate, a source and a drain. The specific structure of the thin film transistor can refer to the prior art and will not be repeated here. The thin film transistor may be a Low Temperature Poly silicon (LTPS) thin film transistor, but is not limited to this.

The light-emitting device layer 200 includes an anode 210, a pixel definition layer 220, a light-emitting functional layer 230, and a cathode 240. The anode 210 is disposed on the drive substrate 100. The pixel definition layer 220 is disposed on the anode 210, the pixel definition layer 220 includes multiple pixel openings, and the pixel openings expose at least a portion of the anode 210. The light-emitting functional layer 230 is located within the pixel opening, and comprises multiple light-emitting units. Each light-emitting unit is correspondingly arranged within the pixel opening. The multiple light-emitting units may include a red light-emitting unit 231, a green light-emitting unit 232, and a blue light-emitting unit 233. The cathode 240 is located on the pixel definition layer 220 and the light-emitting functional layer 230.

In an embodiment, the light-emitting unit comprises a hole injection layer, a hole transport layer, an organic light-emitting layer, an electron transport layer, and an electron injection layer arranged in a stack. The hole injection layer is located near the anode 210, and the electron injection layer is located near the cathode 240. The material of the hole injection layer can be, but is not limited to, at least one of $MoO_3$, HAT-CN, PEDOT:PSS, etc. The material of the hole transport layer may be, but is not limited to, at least one of NPB, TAPC, etc. The material of the organic light-emitting layer can be, but is not limited to, phosphorescent materials based on triplet transition excitons, such as red phosphorescent material Ir (MDQ)2acac, green phosphorescent material Ir (ppy)3, blue phosphorescent material FIrpic, etc. The material of the electron transport layer can be, but is not limited to, at least one of Alq3, TPBi, P0-T2T, Bephen, etc. The material of the electron injection layer can be, but is not limited to, LiF.

The material of the anode 210 can be conductive oxide, metal, transparent conductive polymer, graphene, etc. The conductive oxide may be Indium Tin Oxide (ITO), Indium Zinc Oxide (IZO), or Aluminum-Doped Zinc Oxide (AZO). The metal may be copper (Au). The transparent conductive polymer may be poly (3,4-ethylenedioxythiophene):poly (styrene sulfonate) (PEDOT:PSS), but not limited to this.

The material of the cathode 240 can be, but is not limited to, elemental metal or alloy. The elemental metal may be Li, Mg, Al, Ag, etc, and the alloy may be magnesium silver alloy (10:1), lithium aluminum alloy (0.6% Li), etc, but not limited to these.

The encapsulation layer 300 may include a single-layer or multi-layer encapsulation film layer, which may be an organic film layer or an inorganic film layer, or a combination of the two. For example, the encapsulation layer 300 may include a first inorganic film layer, an organic film layer, and a second inorganic film layer arranged in a stack, but is not limited to these. The encapsulation layer 300 covers the light-emitting device layer 200 and the drive substrate 100 to protect the light-emitting device, while preventing water and oxygen from infiltrating between various film layers, which may affect the performance of the display panel.

The optical film layer 400 is located on the side of the encapsulation layer 300 away from the light-emitting device layer 200, and has an array of openings arranged on the optical film layer 400, and the openings penetrate the optical film layer 400. The material of the optical film layer 400 can be a transparent material, such as a transparent resin material, which will not affect the transmission of light through the optical film layer 400, thereby improving the light intensity loss at large viewing angles. Moreover, along the direction away from the encapsulation layer 300 through the optical film layer 400, the refractive index of the optical film layer 400 gradually decreases. When external incident light enters mediums with different refractive indices, its reflected lights will be interfered and cancelled. Through the gradual decreasing of the refractive index of the optical film layer 400 in the present disclosure, reflection can be reduced due to the principle of interference and cancellation of reflected lights, when light passes through the optical film layer 400, so as to overcome the problem of the strong reflection caused by external environmental light. Therefore, the optical film layer 400 can replace the role of reducing reflection by the black matrix. For the transmitted light, that is, the light emitted from the light-emitting device layer 200, it is incident from the side of the optical film layer 400 near the encapsulation layer 300 to the side of the optical film layer 400 away from the encapsulation layer 300, that is, from a high refractive index medium to a low refractive index medium. Therefore, no phenomenon of interference cancellation will occur. The light can pass through the optical film layer 400 and be emitted, thus avoiding the problem of losing light intensity at large viewing angles caused by traditional black matrix structures.

The color filter layer 500 includes multiple color resistors arranged in an array, and one of the color resistors is correspondingly in one of the openings. The multiple color resistors may include a red color resistor 510, a green color resistor 520, and a blue color resistor 530. The color of the color resistor of the color filter layer 500 corresponds to the color of the light-emitting unit of the light-emitting functional layer 230 respectively. For example, the red color resistor 510 is arranged opposite to the red light-emitting unit 231, the green color resistor 520 is arranged opposite to the green light-emitting unit 232, and the blue color resistor 530 is arranged opposite to the blue light-emitting unit 233. Therefore, the color resistors of the color filter layer 500 only allow lights of the same color to pass through.

The openings on the optical film layer 400 are used to define different color resistors. The orthographic projection of the optical film layer 400 onto the drive substrate 100 is located within the range of the orthographic projection of the pixel definition layer 220 onto the drive substrate 100, so that the orthographic projection of the color filter layer 500 onto the drive substrate 100 can cover the orthographic projection of the light-emitting functional layer 230 onto the drive substrate 100, thereby ensuring the light output rate of the display panel.

Furthermore, the display panel further comprises a cover plate 600, which is located on the side of the color filter layer 500 away from the encapsulation layer 300 and covers the optical film layer 400 and the color filter layer 500. The material of the cover plate 600 can be glass or flexible material. The cover plate 600 can be bonded to the optical film layer 400 and the color filter layer 500 through optical adhesive (OCA).

In some embodiments, the optical film layer 400 comprises multiple film layers arranged in a stack, and the refractive indexes of the multiple film layers decrease sequentially along the direction away from the encapsulation layer 300 through the optical film layer 400. For example, along the direction away from the encapsulation layer 300 through the optical film layer 400, the optical film layer 400 includes a first film layer, a second film layer, . . . , and an Nth film layer arranged in a stack. The refractive index of the first film layer is $n_1$, the refractive index of the second film layer is $n_2$, and the refractive index of the first film layer is $n_N$, where $n_1<n_2< \ldots <n_N$. When external light enters the optical film layer 400, the incident light sequentially passes through the first film layer, the second film layer, . . . , and the Nth film layer. According to the principle of interference cancellation of reflected light, when the incident light enters medium layers with different refractive indexes, reflected lights from it will generate interference cancellation, thereby reducing reflection. Therefore, the optical film layer 400 can overcome the problem of the strong reflection caused by external environmental light.

In some embodiments, the optical film layer 400 comprises a first film layer 410 and a second film layer 420 arranged in a stack. The first film layer 410 is located near the encapsulation layer 300, and the refractive index of the first film layer 410 is greater than that of the second film layer 420. For example, the refractive index of the first film layer 410 is $n_1$, and the refractive index of the second film layer 420 is $n_2$, where $n_1>n_2$.

Furthermore, the refractive index of the first film layer 410 is in a range of 1.61-1.65, and the refractive index of the second film layer 420 is in a range of 1.35-1.39. When the refractive index $n_1$ of the first film layer 410 and the refractive index $n_2$ of the second film layer 420 are within the above ranges respectively, the display panel represents a good display performance. When the refractive index $n_1$ of the first film layer 410 and the refractive index $n_2$ of the second film layer 420 are outside of (less than or greater than) the above ranges respectively, the display panel represents a poor display performance.

In some embodiments, the first film layer 410 comprises a first main material, and the first main material comprises resin, and the second film layer 420 comprises a second main material, and the second main material comprises fluorine-containing resin. The refractive indexes of typical resin materials are generally around 1.5 (approximately). In order to reduce the refractive index of the second film layer 420, introducing fluorine elements into the resin material can lower the refractive index of the resin, so that the refractive index of the second film layer 420 is less than that of the first film layer 410. Therefore, the second main material of the second film layer 420 can be a fluorine-containing resin material, and the refractive index of the fluorine-containing resin material can be adjusted (i.e., reduced, decreased) to around 1.4 (approximately). The fluorine-containing material may be a fluorine-containing UV curable resin, such as a fluorine-containing polymer copolymerized from perfluoroolefin monomer, vinyl ether acrylate monomer, vinyl hydroxyethyl ether, and ethylene monomer, such as fluorine-containing epoxy acrylate oligomer, fluorine-containing polyurethane acrylate oligomer, but not limited to these. The first main material of the first film layer 410 may include UV curable resin (fluorine free), such as epoxy acrylate oligomer, but not limited to this.

Figure 3:
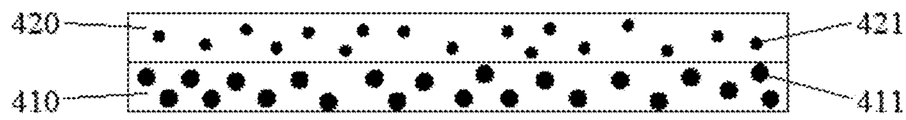
FIG. 3 is a schematic diagram of a structure of an optical film layer of a display panel according to an embodiment of the present disclosure.

In some embodiments, as shown in FIG. 3, the first film layer 410 further includes a first particle 411, and the second film layer 420 further includes a second particle 421. The first particle 411 is dispersed in the first main material, and the second particle 421 is dispersed in the second main material. Furthermore, the refractive index of the first particle is in a range of 1.6-2.3, and the refractive index of the second particle is in a range of 1.2-1.35. The reflection effect of the optical film layer 400 is related to the refractive indexes of the first film layer 410 and the second film layer 420. In order to improve the optical performance of the optical film layer 400, particles are added to the optical film layer 400 to further increase the refractive index of the first film layer 410 and decrease the refractive index of the second film layer 420. Due to the refractive index range of the resin material being around 1.5 (approximately), which is far from meeting the requirement of a high refractive index in the range of 1.61-1.65, and therefore, the first particle 411 having a relatively high refractive index is added to the first film layer 410 to further increase the overall refractive index of the first film layer 410 and control its refractive index so as to be within the range of 1.61-1.65. The refractive index of the fluorine-containing resin material is around 1.4 (approximately), which does not meet the requirement of a low refractive index in the range of 1.35-1.39, and therefore, the second particle 421 having a relatively low refractive index is added to the second film layer 420 to further reduce the overall refractive index of the second film layer 420 and control its refractive index so as to be within the range of 1.35-1.39.

In some embodiments, the material of the first particle 411 may be low refractive index inorganic material particles, such as hollow silica particles; the material of the second particle 421 can be high refractive index metal oxide particles, such as zinc oxide nanoparticles (n=1.9), titanium oxide nanoparticles (n=2.1~2.3), tin oxide nanoparticles (n=1.9), but not limited to these.

It should be noted that in the first film layer 410, there is a non-periodic distribution of multiple first particles 411, and the materials of the multiple first particles 411 may be the same or different; and in the second film layer 420, there is a non-periodic distribution of multiple second particles 421, and the materials of the multiple second particles 421 may be the same or different.

Specifically, as shown in FIG. 3, the material of the first film layer 410 includes UV curable resin (such as epoxy acrylate oligomer), UV curable monomers (such as trimethylolpropane triacrylate TMPTA, pentaerythritol triacrylate PETA, dipentaerythritol hexadecanoate DPHA, etc.), photoinitiators (such as free radical photoinitiators, anionic photoinitiators, cationic photoinitiators, etc.), and modified metal oxide particles (such as zinc oxide nanoparticles (n=1.9), titanium oxide nanoparticles (n=2.1-2.3), tin oxide nanoparticles (n=1.9)). The overall refractive index of the first film layer 410 is in the range of 1.61-1.65.

The material of the second film layer 420 includes fluorinated UV curable resin (such as fluorinated epoxy acrylate oligomers, fluorinated polyurethane acrylate oligomers), UV curable monomers (such as trimethylolpropane triacrylate TMPTA, pentaerythritol triacrylate PETA, dipentaerythritol acrylate DPHA), and inorganic particles having low refractive index (such as hollow silica particles). The overall refractive index of the second film layer 420 is in the range of 1.35-1.39.

In some embodiments, the thickness of the first film layer 410 is in a range of 3 μm to 4 μm, and the thickness of the second film layer 420 is in a range of 80 nm to 110 nm. The reflection effect of the optical film layer 400 is related to the thickness of the film layers. When the thickness of the first film layer 410 and the thickness of the second film layer 420 are within the above ranges, respectively, the display panel represents a good display performance. When the thickness of the first film layer 410 and the thickness of the second film layer 420 are outside of (less than or greater than) the above ranges, respectively, the display panel represents a poor display performance.

An embodiment of the present disclosure further provides a display device comprising a display panel as described in any one of the embodiments above. The display device can be any of a television, a tablet computer, a smart home appliance, and a solid-state lighting source, but is not limited to these.

In summary, the present disclosure provides a display panel and a display device, and in the structure of the display panel of the present disclosure, an optical film layer is used to replace the black matrix (BM) structure in the prior art. Additionally, in the direction away from the encapsulation layer through the optical film layer, the refractive index of the optical film layer gradually decreases. When light passes through the optical film layer, due to the principle of interference and cancellation of reflected lights, it can reduce reflection and overcome the strong reflection problem caused by external environmental light, at the same time, the optical film layer does not affect the transmitted lights, which can improve the color glare phenomenon and the problem of losing light intensity caused by the BM structure in the prior art, effectively increase the light utilization rate, improve the display effect of the display panel, and reduce costs.

In summary, although the present disclosure has disclosed the preferred embodiments as described above, the preferred embodiments are not intended to limit the present disclosure, ordinary skilled persons in the art may make various changes and modifications without departing from the idea and the scope of the present disclosure. Therefore, the scope of protection of the present disclosure shall be subject to the scope defined by the claims.

What is claimed is:

1. A display panel comprising:

a drive substrate;

a light-emitting device layer located on the drive substrate;

an encapsulation layer covering the light-emitting device layer;

an optical film layer located on the encapsulation layer, wherein the optical film layer is provided with multiple openings; and a color filter layer comprising multiple color resistors, wherein the color resistors are arranged within the opening;

wherein a refractive index of the optical film layer gradually decreases along a direction away from the encapsulation layer through the optical film layer; and wherein the optical film layer comprises a first film layer and a second film layer arranged in a stack, a refractive index of the first film layer is in a range of 1.61-1.65, and a refractive index of the second film layer is in a range of 1.35-1.39.

2. The display panel of claim 1, wherein the optical film layer comprises multiple film layers arranged in a stack, and refractive indexes of the multiple film layers decrease sequentially along the direction away from the encapsulation layer.

3. The display panel of claim 2, wherein the first film layer is adjacent to the encapsulation layer, and the refractive index of the first film layer is greater than that of the second film layer.

4. The display panel of claim 3, wherein the first film layer comprises a first main material comprising resin, and the second film layer comprises a second main material comprising a fluorine-containing resin.

5. The display panel of claim 4, wherein the first film layer further comprises a first particle, and the second film layer further comprises a second particle, the first particle is dispersed in the first main material and the second particle is dispersed in the second main material.

6. The display panel of claim 5, wherein the refractive index of the first particle is in a range of 1.6-2.3, and the refractive index range of the second particle is in a range of 1.2-1.35.

7. The display panel of claim 5, wherein the material of the first particle is an inorganic material, and the material of the second particle is a metal oxide.

8. The display panel of claim 3, wherein a thickness of the first film layer is in a range of 3 μm to 4 μm, and a thickness of the second film layer is in a range of 80 nm to 110 nm.

9. The display panel of claim 1, wherein the optical film layer is made of a transparent material.

10. A display device comprising the display panel of claim 1.

11. A display panel comprising:

a drive substrate;

a light-emitting device layer located on the drive substrate;

an encapsulation layer covering the light-emitting device layer;

an optical film layer located on the encapsulation layer, wherein the optical film layer is provided with multiple openings; and a color filter layer comprising multiple color resistors, wherein the color resistors are arranged within the opening;

wherein a refractive index of the optical film layer gradually decreases along a direction away from the encapsulation layer through the optical film layer;

wherein the optical film layer comprises a first film layer and a second film layer arranged in a stack, a thickness of the first film layer is in a range of 3 μm to 4 μm, and a thickness of the second film layer is in a range of 80 nm to 110 nm.

12. The display panel of claim 11, wherein the optical film layer comprises multiple film layers arranged in a stack, and refractive indexes of the multiple film layers decrease sequentially along the direction away from the encapsulation layer.

13. The display panel of claim 11, wherein the first film layer is adjacent to the encapsulation layer, and a refractive index of the first film layer is greater than that of the second film layer.

14. The display panel of claim 11, wherein the first film layer comprises a first main material comprising resin, and the second film layer comprises a second main material comprising a fluorine-containing resin.

15. The display panel of claim 11, wherein the first film layer further comprises a first particle, and the second film layer further comprises a second particle, the first particle is dispersed in the first main material, and the second particle is dispersed in the second main material.

16. The display panel of claim 15, wherein the refractive index of the first particle is in a range of 1.6-2.3, and the refractive index range of the second particle is in a range of 1.2-1.35.

17. The display panel of claim 15, wherein the material of the first particle is an inorganic material, and the material of the second particle is a metal oxide.

18. A display panel comprising:

a drive substrate;

a light-emitting device layer located on the drive substrate;

an encapsulation layer covering the light-emitting device layer;

an optical film layer located on the encapsulation layer, wherein the optical film layer is provided with multiple openings; and a color filter layer comprising multiple color resistors, wherein the color resistors are arranged within the opening;

wherein a refractive index of the optical film layer gradually decreases along a direction away from the encapsulation layer through the optical film layer;

wherein the optical film layer comprises a first film layer and a second film layer arranged in a stack, the first film layer comprises a first main material comprising resin, and the second film layer comprises a second main material comprising a fluorine-containing resin.

19. The display panel of claim 18, wherein the optical film layer comprises multiple film layers arranged in a stack, and refractive indexes of the multiple film layers decrease sequentially along the direction away from the encapsulation layer.

* * * * *